United States Patent [19]
Yokoyama et al.

[11] Patent Number: 4,812,355
[45] Date of Patent: Mar. 14, 1989

[54] FINISH LAMINATES FOR HIGH FREQUENCY CIRCUITS

[75] Inventors: Shigeki Yokoyama, Yokohama; Takeshi Kamiya, Kamakura; Takeo Niikawa, Yokohama; Masakatsu Nagase, Yamato; Tetujiro Kuroishi, Sodegaura, all of Japan

[73] Assignees: Nippon Petrochemicals Co., Ltd., Chiyoda; Chukoh Chemical Industries, Ltd., Tokyo, both of Japan

[21] Appl. No.: 171,910

[22] Filed: Mar. 22, 1988

[30] Foreign Application Priority Data

Mar. 26, 1987 [JP] Japan ................ 62-70303
Mar. 26, 1987 [JP] Japan ................ 62-70304
Mar. 26, 1987 [JP] Japan ................ 62-70305

[51] Int. Cl.$^4$ .................. B32B 7/02; B32B 15/08; B32B 17/10
[52] U.S. Cl. .................. 428/215; 428/246; 428/251; 428/432; 428/441; 428/461; 428/901
[58] Field of Search .............. 428/251, 246, 901, 432, 428/441, 215, 461

[56] References Cited

U.S. PATENT DOCUMENTS

| | | | |
|---|---|---|---|
| 4,378,403 | 3/1983 | Kotcharian | 428/251 |
| 4,686,133 | 8/1987 | Nakabayashi et al. | 428/461 X |
| 4,707,565 | 11/1987 | Kasai et al. | 428/251 X |
| 4,713,284 | 12/1987 | Hasegawa et al. | 428/246 |
| 4,738,890 | 4/1988 | Tohrin et al. | 428/901 X |

*Primary Examiner*—Thomas J. Herbert
*Attorney, Agent, or Firm*—Bucknam and Archer

[57] ABSTRACT

A finish laminate for high-frequency circuits, which consists of a metal-covered multilayer structure composed of (I) at least one fundamental laminate in which a glass cloth layer (C) is laminated on at least one side of an ultrahigh molecular-weight polyethylene layer (A) with an adhesive layer (B) interposed between the layers (C) and (A), one fundamental laminate being able to be laminated on another with an adhesive layer (B) interposed therebetween, and (II) a metal foil laminated on at least one outermost layer of the multilayer structure with an adhesive layer interposed therebetween. In one embodiment, the glass cloth layer may be impregnated with a curable thermosetting resin or with this resin and a thermoplastic resin to form a resin-containing glass cloth layer ($C_1$) or ($C_2$), thereby dispensing with an adhesive layer (B) when laminating a metal foil on the outermost layer of the multilayer structure.

18 Claims, 2 Drawing Sheets

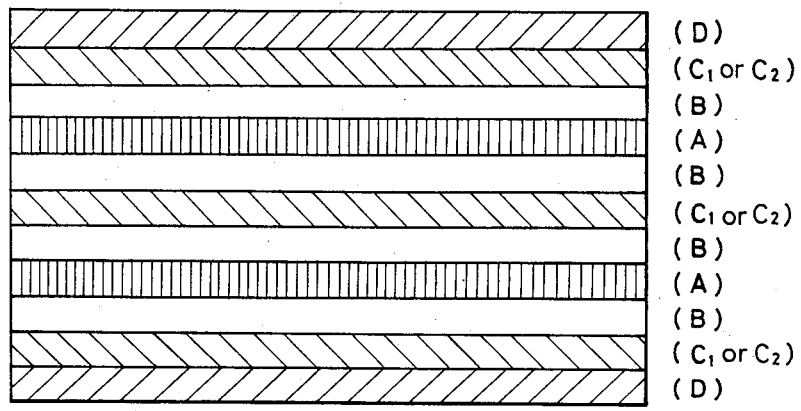
F I G. 1

FINISH LAMINATES FOR HIGH FREQUENCY CIRCUITS

BACKGROUND OF THE INVENTION

1. Field of the Invention

This invention relates to finish laminates for high frequency circuits and more particularly to such laminates which are excellent in solder heat resistance, dimensional stability and mechanical strength and will not warp during their use whereby they are adapted for use as a circuit board for microwave apparatuses, 2. Description of the Prior Art With the recent remarkable progress or development of the information-oriented society, frequency bands corresponding to microwaves are also being increasingly used in satellite communications, personal radios and the like.

The effects of signal speeds and losses on circuit performances are great in microwave bands. Thus, individual tip parts and laminates for a circuit as well as the whole of the circuit are required to be increased in signal speeds and decreased in losses in the high-frequency band. More specifically, the signal speed in the circuit on the laminate depends on the dielectric constant of dielectric substances and the former becomes higher as the latter becomes lower. Further, the signal loss increases with an increase in the product of the dielectric constant and dielectric tangent. It is therefore preferred that the laminates used in microwave bands be lower in dielectric constant and dielectric tangent.

The metal-covered laminates now used in microwave apparatuses includes a copper-covered epoxy resinimpregnated glass cloth laminate (hereinafter referred to as an "epoxy-glass material") and a copper-covered fluorine resin-impregnated glass cloth laminate (hereinafter referred to as a "fluorine-glass material").

The epoxy-glass material has, however, great dielectric constant and dielectric magnet tangent and it will not be able to be used since the circuit loss increases when the frequency used exceeds 1 GHz. In addition, the epoxy-glass material will cause water aborption due to a change in environments because of its high water absorbability, whereby it is deteriorated in electrical properties.

The fluorine-glass material is excellent in electrical properties, but it will require a special surface treatment when the through holes therein are plated, has poor adhesiveness to metals, is very expensive and raises other problems.

Further, there is proposed an alternative method using polyolefin as a dielectric material layer. Not only polyolefin is low in strength of bond to a metal foil because of its non-polarity, but also polyolefin layers are apt to cause warp therein, thus raising undesirable problems.

To solve these problems, there have been proposed substrate boards for circuits, in which substrates a bond between polyolefin and a metal is improved by interposing therebetween a layer of polyolefin modified with an unsaturated carboxylic acid or the like (Japanese Pat. Appln. Laid-Open Gazettes Nos. 61-193844, 61-193845 and 61-193846).

The substrates so proposed are, however, inferior in solder heat resistance, dimensional stability, mechanical strength and the like and do not meet the above practical properties required for laminates for use in high-frequency circuits.

In addition, Japanese Pat. Appln. Laid-Open Gazette No. 61-108202 discloses a copper-covered laminate prepared by impregnating glass cloth with polyethylene and then irradiating electron beams to the thus impregnated glass cloth to crosslink the polyethylene so impregnated. The laminate so prepared is satisfactory in electrical properties, but it is still unsatisfactory in bond strength, solder heat resistance, dimensional stability and the like. It further raises a problem as to the generation of warp.

SUMMARY OF THE INVENTION

The primary object of this invention is to provide finish laminates for high-frequency circuits, which laminates retain their electrical properties, bond strength, etc. at high levels, are excellent in heat resistance in soldering, dimensional stability and mechanical strength without causing any warp and are inexpensive.

The above object of this invention may be achieved by the provision of a finish laminate having the following structure.

The finish laminate so provided consists characteristically of a metal foil-covered multilayer structure composed of (I) at least one fundamental laminate in which a glass cloth layer (C) is laminated on at least one side of an ultrahigh molecular-weight polyolefin layer (A) with an adhesive layer (B) interposed between the layers (C) and (A), the layer (B) being made of at least one member selected from the group consisting of polyolefins modified with an unsaturated carboxylic acid or derivative thereof, and epoxy group-containing olefinic polymers, one fundamental laminate being able to be laminated with another by interposing therebetween an adhesive layer (B), and (II) a metal foil (D) laminated on at least one outermost layer of the multilayer structure with an adhesive layer (B) interposed between said foil and outermost layer.

According to this invention, the glass cloth layer (C) may be substituted by a glass cloth layer ($C_1$) impregnated with a curable resin or by a glass cloth layer ($C_2$) impregnated with a curable resin and at least one member selected from the group consisting of ethylenecarboxylic acid copolymers, ethylene-carboxylic ester copolymers, ethylene-carboxylic acid-carboxylic ester copolymers and salts of these copolymers.

It is preferable from the viewpoint of electrical properties that the ultrahigh molecular-weight polyethylene making up the layer (A) used in this invention be one which has an intrinsic viscosity (or limiting viscosity number) of at least 8 dl/g and a molecular weight of at least one million. The polyethylene used herein includes ethylene homopolymers, copolymers of ethylene and another $\alpha$-olefin such as propylene, butene-1, pentene-1, hexene-1, octene-1, 4-methyl-1-pentene or styrene; crosslinked polyethylene; chlorinated ethylene polymers; and mixtures thereof. The ultrahigh molecular-weight polyethylene layer (A) has a thickness of preferably 30–1000 $\mu$m.

On one or both sides of the layer (A) is laminated the adhesive layer (B) made of polyolefin modified with an unsaturated carboxylic acid or a derivative thereof, and/or an epoxy group-containing olefinic polymer. The polyolefin (or olefin polymer) used in the preparation of said modified polyolefin includes a homopolymer of low-, medium- or high-density polyethylene, polypropylene, polybutene-1, poly-4-methyl-pentene-1 or the like, a copolymer of ethylene or propylene as the principal component with another 60-olefin or polar monomer. Typical of the copolymers are ethylene-propylene copolymers, ethylene-butene-1 copolymers, ethylene-hexene-1 copolymers, ethylene-4-methyl-pentene-1 copolymers, ethylene-octene-1 copolymers, propylene-ethylene copolymers, propylene-butene-1 copolymers, ethylene-vinyl acetate copolymers, ethylene-acrylic acid copolymers and mixtures thereof.

The unsaturated carboxylic acids used for the modification of polyolefin include monobasic and dibasic acids such as acrylic, methacrylic, maleic, fumaric, crotonic, itaconic and citraconic acids. In addition, the derivatives of the above unsaturated carboxylic acids include metal salts, amides, imides, esters and anhydrides thereof with maleic anhydride being the most preferred.

These unsaturated carboxylic acids or the derivatives thereof may be added to the polyolefin in an amount by weight of 0.05–10%, preferably 0.1–5.0%, more preferably 0.1–2.0%, of the polyolefin. The polyolefin is modified with the carboxylic compound by heating in the presence of an organic peroxide which is illustrated by benzoyl peroxide, lauryl peroxide or 2,5-di(butyl peroxide) hexin.

The layer (B) of the polyolefin so modified with the unsaturated carboxylic compound (hereinafter being referred to as "modified polyolefin" for simplicity) may preferably be 10–100 $\mu$m in thickness. The modified polyolefin may be diluted with non-modified polyolefin to form a mixture for use.

The epoxy group-containing olefinic polymer used herein may preferably be a copolymer prepared by the high-pressure radical polymerization of an olefin and an unsaturated glycidyl group-containing monomer, a terpolymer of an olefin, an unsaturated glycidyl group-containing monomer and an ethylenically unsaturated monomer, or a more multiple-component polymer. The olefin component of the above polymers may preferably be ethylene; and polymers prepared from 50–99.95 wt. % of ethylene, 0.05–50 wt. % of a glycidyl group-containing monomer and 0–49.95 wt. % of an ethylenically unsaturated monomer, are preferred.

The unsaturated glycidyl group-containing monomers include glycidyl esters such as glycidyl acrylate, glycidyl methacrylate, itaconic acid monoglycidyl ester, butenetricarboxylic acid monoglycidyl ester, butenetricarboxylic diglycidyl ester, butenetricarboxylic acid triglycidyl ester, as well as $\alpha$-chloroallyl, maleic acid, crotonic acid and fumaric acid glycidyl esters; glycidyl ethers such as vinyl glycidyl ether, allyl glycidyl ether, 2-methylallyl glycidyl ether, glycidyl oxyethylvinyl ether and styrene-p-glycidyl ether; and p-glycidyl styrene. Among these compounds, glycidyl (meth)acrylate and allyl glycidyl ether are particularly preferred.

The ethylenically unsaturated monomer used herein is at least one monomer selected from the group consisting of olefins, vinyl esters, $\alpha,\beta$-ethylenically unsaturated carboxylic acids and derivatives thereof and includes olefins such as propylene, butene-1, hexene-1, decene-1, octene-1 and styrene; vinyl esters such as vinyl acetate, vinyl propionate and vinyl benzoate; esters such as methyl-, ethyl-, propyl, butyl-, 2-ethylhexyl, cyclohexyl-, dodecyl- and octadecyl esters of acrylic acid or methacrylic acid; mono- and di-ester of maleic acid, maleic anhydride, itaconic acid and fumaric acid; vinyl chloride; vinyl ethers such as vinyl methyl ether and vinyl ethyl ether; and acrylic acid amide type compounds, with acrylic acid esters being particularly preferable.

The epoxy group-containing olefinic polymers are prepared by a high-pressure radical polymerizing method and more specifically they are prepared by introducing 50–99.95 wt. % of ethylene, 0.05–50 wt. % of at least one unsaturated glycidyl group-containing monomer and 0–49.95 wt. % of another ethylenically unsaturated monomer into an autoclave reactor or tubular reactor and then polymerizing the thus introduced monomers simultaneously or by stepwise contact, in the presence of a free radical catalyst in an amount by weight of 0.0001 to 1% of the total weight of the total monomers and in the presence of a chain transfer agent together with or without an adjuvant, at a polymerization pressure of 500–4000 Kg/cm$^2$, preferably 1000–3500 Kg/cm$^2$, and a reaction temperature of 50°–400° C., preferably 100°–350° C.

The free radical catalysts include usual initiators such as peroxides, hydroperoxides, azo compounds, amineoxide compounds and oxygen.

The chain transfer agents include hydrogen, propylene, butene-1, $C_1$–$C_{20}$ and higher saturated aliphatic hydrocarbons and halogenated hydrocarbons such as methane, ethane, propane, butane, isobutane, n-hexane, n-heptane, cycloparaffins, chloroform and carbon tetrachloride, and also include $C_1$–$C_{20}$ and higher saturated aliphatic alcohols such as methanol, ethanol, propanol and isopropanol, as well as $C_1$–$C_{20}$ and higher saturated aliphatic carbonyl compounds such as carbon dioxide, acetone and methyl ethyl ketone, and aromatic compounds such as toluene, diethylbenzene and xylene.

Further, in this invention, said epoxy groupcontaining olefinic polymers may be used in place of the previously mentioned mixture of the modified polyolefin and non-modified polyolefin which is used for the dilution of the former; in this case, the mixing ratio should be such that the concentration of the epoxy group-containing monomer is in the range of 0.05–50 wt. %. If the concentration is less than 0.05 wt. %, the resulting final products will be low in interlayer peel strength whereby they are possibly made unsuitable for practical use, whereas the concentration exceeds 50 wt. %, then the resulting final products will be difficult to handle.

The thickness of the layer made of the thus prepared epoxy group-containing olefinic polymers is preferably in the range of about 10-about 100 $\mu$m.

The glass cloth layer (C) is then laminated on the surface of the adhesive layer (B). The glass cloth used herein may be one prepared by knitting or interweaving glass fibers. The glass cloth layer is preferably 30–100 $\mu$m in thickness.

In cases where the curable resin-impregnated glass cloth layer (C$_1$) is used in place of the glass cloth layer (C), the metal layer can be laminated on the layer (C$_1$) without the adhesive layer (B). The preferable curable resins used herein include epoxy resins such as polyester resins and bisphenol-type epoxy resins; phenolic resins such as resol-type phenol resins; melamine resins; and diallylphthalate resins. These resins are made into pre-pregs, premixes, or resin varnishes by diluting with an organic solvent or water to obtain a varnish containing a predetermined concentration of resin, and then impregnated into glass cloths. It is preferable that the amounts of these curable resins impregnated be in the range of 10–45 wt. % of glass cloth. If the amount so impregnated is less than 10 wt. %, the resulting glass cloth layer will be low in adhesiveness to a copper plate whereby the ultrahigh molecular-weight polyethylene core material in the resulting finish laminate is made likely to be deformed. If, on the other hand, the amount so impregnated exceeds 45 wt. %, then the resulting finish laminate will be poor in electrical properties whereby no improvement of signal speed is made. The resin varnish-impregnated glass cloth layer is preferably 20–150 μm in thickness.

The glass cloth layer $(C_2)$ which is impregnated with the curable resin and at least one member selected from the group consisting of ethylene-carboxylic acid copolymers, ethylene-carboxylic acid-carboxylic acid ester copolymers and salts of these copolymers, may be laminated on the surface of the adhesive layer (B). The layer $(C_2)$ has a thickness of preferably 20–150 μm.

The above copolymers and salts include interpolymers such as ethylene-methacrylic acid copolymers, ethylene-acrylic acid copolymers and ethylene-maleic acid copolymers, as well as terpolymers such as ethylenemethacrylic acid-methacrylic acid ethyl ester copolymers and ethylene-acrylic acid-acrylic acid ethyl ester copolymers, with ethylene-acrylic acid copolymers and ethylene-acrylic acid-acrylic acid ethyl ester copolymers being particularly preferred, and also include salts of the above interpolymers and terpolymers, the salts being prepared by perfectly or partially neutralizing said polymers with inorganic or organic basic compounds such as sodium hydroxide, magnesium hydroxide, other alkali metal compounds, alkaline earth metal compounds, ammonia or amines which will exhibit basicity in water.

Among the above ethylene-carboxylic acid copolymers or the ethylene-carboxylic acid-carboxylic acid ester terpolymers, those having a viscosity average molecular weight of as low as 500–20000 are preferable because of their good compatibility with the resin varnishes. The polymers having such a low molecular weight as above may be prepared by directly copolymerizing ethylene with an unsaturated carboxylic acid, but they may preferably be prepared by heating ethylene-carboxylic acid ester copolymers having a relatively high molecular weight to 200°–500° C. in the presence of water or steam in an inert atmosphere to thermally reduce said copolymers in molecular weight, the latter preparation method being advantageous in that the intended products are obtained at a lower cost and the molecular weight of the resulting products is optionally controlled.

According to this invention, a metal foil may be laminated on the surface of the glass cloth layer $(C_2)$ which is impregnated with the curable resin and at least one member selected from the group consisting of ethylene-carboxylic acid copolymers, ethylene-carboxylic acid-carboxylic acid ester copolymers and salts of these copolymers. The metal of the metal foil or sheet includes copper, aluminum, nickel, iron or the like, as well as an alloy thereof, among which copper is particularly preferred. The metal foil or sheet has a thickness of preferably 5–70 μm, more preferably 10–50 μm.

According to this invention, the fundamental laminate is made from the ultrahigh molecular-weight polyethylene layer (A)/the adhesive layer (B)/the glass cloth layer (C), $(C_1)$ or $(C_2)$. The fundamental laminates each made from (A)/(B)/(C), $(C_1)$ or $(C_2)$ may be laminated together with an adhesive layer (B) interposed between the layer (A) of one fundamental laminate and the layer (C), $(C_1)$ or $(C_2)$ of the adjacent fundamental laminate to form a multilayer structure. The metal foil (D) may be laminated on the outermost layer (A), layer (C) or both of the multilayer structure with an adhesive layer (B) interposed between the outermost layer (A) and the metal foil (D) and/or between the outermost layer (C) and the metal foil (D) to obtain a metal foil-covered multilayer structure which is a finish laminate for high-frequency circuits.

Alternatively, the metal foil (D) may also be laminated on the outermost layer or layers of the multilayer structure without an adhesive layer (B) interposed between the metal foil (D) and the outermost layer if said outermost layer or layers are the layers $(C_1)$ or $(C_2)$.

Thus, the finish laminates of this invention are illustrated in two styles as indicated below:

1. A/B/C/B/D, D/B/A/B/C/B/D, D/B/C/B/A/B/C/B/D, D/B/C/B/A/B/C/-B/A/B/C/B/D, etc.

2. A/B/$C_1$ or $C_2$/D, D/B/A/B/$C_1$ or $C_2$/D, D/$C_1$ or $C_2$/B/A/B/$C_1$ or $C_2$/D, D/$C_1$ or $C_2$/B/A/B/$C_1$ or $C_2$/D, etc.

What finish laminates should be prepared is determined depending on mechanical strengths such as rigidity and bend strength, heat resistance, and the like required for the use of the resulting finish laminates.

For example, in case where there is prepared a finish laminate of this invention having a thickness of 0.8–1.0 mm, three of the fundamental laminate are laminated together so that the resulting multilayer structure contains three of the layer (C), $(C_1)$ or $(C_2)$ to increase the resulting finish laminate in dimensional stability, solder heat resistance and mechanical strength, while in the case of the resulting finish laminate being at least 1 mm in thickness, at least 4 of the fundamental laminates are laminated together so that the resulting multilayer structure has an increased number of (C, $C_1$ or $C_2$)/(A) combinations and contains at least 4 of the layer (C), $(C_1)$ or $(C_2)$ for the same purpose as above. The thickness of glass cloth and the amount of curable resins impregnated thereinto and particularly important and, to obtain satisfactory finish laminates, it is desired that the glass cloth have a small thickness and a high weave density and the amount of curable resins impregnated be as small as possible. Thus, for example, the use of two (C) layers each having a thickness of 40 μm is advantageous over the use of one (C) layer having a thickness of 80 μm to enhance the strength and electrical properties of the resulting finish laminate and facilitate the thermal diffusion at the time of soldering the materials for a finish laminate. This is also true with the layer $(C_1)$ or $(C_2)$.

In order to apply the finish laminate to a planar antenna, a pattern is described on one side of the laminate and the copper foil thereof is removed; at this time the laminate may warp in some cases. Such warp [expressed by the formula: (Distance between the tip of warped portion of laminate and the original position of the tip ÷ Length of laminate) × 100%] may be caused in a warp degree of at least 10% in the finish laminate containing two of the layer (C), $(C_1)$ or $(C_2)$, whereas it may be caused in a warp degree of 5% or lower in the finish laminate containing three of the layer (C), $(C_1)$ or $(C_2)$. Accordingly, it is desirable that a finish laminate containing at least 3 of the (C), $(C_1)$ or $(C_2)$ layer be used for the planar antenna.

The component layers are overlapped one another in the previously mentioned specific order and then pressed at 5 Kg/cm² and at least 170° C. for at least 30 minutes to obtain a finish laminate of this invention for high-frequency circuits.

Further, the modified polyolefin may be extruded through extruders to form adhesive layers (B) simultaneously with drawing out the other layers, whereupon all the layers are overlapped one another and pressed together to continuously produce laminates.

BRIEF DESCRIPTION OF DRAWING

FIGS. 1 and 2 each show of the cross-section of an example of finish laminate of this invention for high-frequency circuits.

DESCRIPTION OF THE PREFERRED EMBODIMENTS

Figure 2:
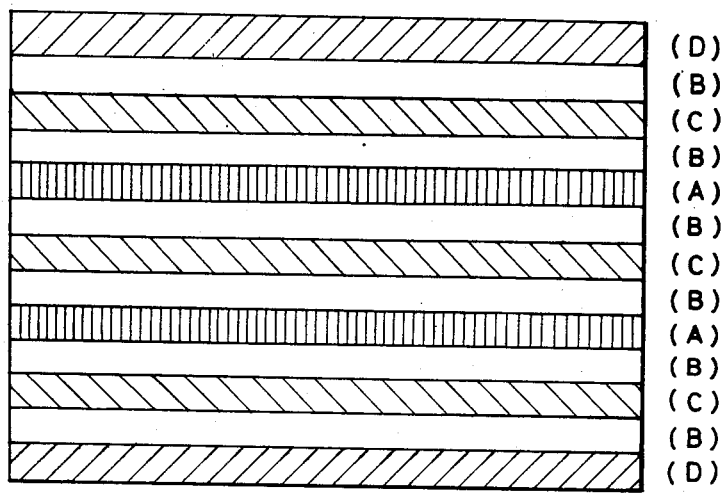

This invention will be better understood by the following Examples and Comparative Examples.

EXAMPLE 1

(A) Ultrahigh molecular-weight polyethylene (molecular weight, three million; limiting viscosity number, 17 dl/g in decalin solution at 135° C.) produced under the tradename of TUFTAREX by Nippon Petrochemical Co., Ltd.

Thickness: $A_1$, 130 μm; $A_2$, 250 μm (B) Maleic anhydride-modified polyethylene (MI, 1.0 g/10 min.; d, 0.923 g/cm$^3$) produced under the tradename of NISSEKI "N" POLYMER L 6033 by Nippon Petrochemical Co., Ltd.

Thickness: 70 μm ($C_1$) Epoxy resin-impregnated glass cloth

Preparation of prepregs

Formulation of resin varnish:

(1) Epoxy resin (EP No. 1001): 100 g (2) Dicyandiamide (DICY): 4 g
(3) Benzyldimethylamine (BDMA): 0.2 g
(4) Methyl ethyl ketone (MEK): 227 g
(5) Demethylformamide (DMF): 113 g Glass cloths were impregnated with a resin varnish prepared from the above materials (1) to (5) to the extent that a ratio by weight of the epoxy resin to the glass cloth reached 30:70, air-dried for 25 minutes and then dried in a hot-air drying oven at 160° C. for 4 minutes thereby to obtain prepregs.

(D) Copper foils (35 μm)

The above-mentioned layers (A, B, $C_1$ and D) were overlapped one another in the order indicated in FIG. 1 and the pressed together by a heat press molder at 170° C. and 5 Kg/cm$^2$ for 30 minutes thereby to obtain a finish laminate (D/$C_1$/B/$A_1$/B/$C_1$/B/$A_1$/B/$C_1$/D) of this invention which was then evaluated for peel strength (bond strength), electrical properties (dielectric constant, dielectric tangent and insulation resistance), water absorbability, workability, solder heat resistance, post-soldering appearance and dimensional stability (linear expansion coefficient), with the results being shown in Table 1. In the evaluation for post-soldering appearance in Table 1, indicates no fusion and swelling of the surface of dielectric body, and X indicates fusion and swelling of the surface thereof.

EXAMPLE 2

The procedure of Example 1 was followed except that the layers $A_2$ were substituted for the layers $A_1$, thereby to obtain a finish laminate (D/$C_1$/B/$A_2$/B/$C_1$/B/$A_2$/B/$C_1$/D) which was then evaluated in the same manner as in Example 1. The results are also shown in Table 1.

COMPARATIVE EXAMPLES 1-2

Heretofore commercially available epoxy resin-impregnated glass cloth laminates (epoxy-glass material: Comparative Example 1) and flourine resin-impregnated glass cloth laminates (fluorine-glass material) were evaluated in the same manner as in Example 1 with the results being also shown in Table 1.

COMPARATIVE EXAMPLE 3

Following the procedure of Example 1, but using as the layer (B) an impregnated glass cloth prepared by impregnating a glass cloth with polyethylene and irradiating electron beams on the thus impregnated glass cloth to crosslink the polyethylene so impregnated, thereby to obtain a laminate which was evaluated as previously mentioned. The results are also shown in Table 1.

TABLE 1

| Test item | Test condition | Example 1 | Example 2 | Comp. Example 1 | Comp. Example 2 | Comp. Example 3 | Method for measurement |
| --- | --- | --- | --- | --- | --- | --- | --- |
| Bond strength (Kg/cm) | 23° C. | 1.9 | 1.9 | 2.2 | 1.8 | 2.8 | JIS C 6481 |
| Dielectric constant | 12 GHz | 2.4 | 2.4 | 4.5 | 2.6 | 2.5 | Disc resonator method |
| Dielectric tangent | 12 GHz | $2.0 \times 10^{-3}$ | $1.5 \times 10^{-3}$ | $2.0 \times 10^{-3}$ | $2.0 \times 10^{-3}$ | $1.6 \times 10^{-3}$ | Disc resonator method |
| Insulation resistance Ω | 23° C. | $4.0 \times 10^{14}$ | $6.0 \times 10^{14}$ | $1.0 \times 10^{15}$ | $4.0 \times 10^{13}$ | $1.0 \times 10^{14}$ | JIS C 6481 |
| Water absorbability % | 23° C., 24 hr | 0.01 | 0.01 | 0.1 | 0.02 | 0.03 | JIS C 6481 |
| Heat resistance to soldering | | Acceptable | Acceptable | Satisfactory | Satisfactory | Unacceptable | |
| Post-soldering appearance | | | | | | X | |
| Dimensional stability | $\times 10^{-5}$ | 4.0 | 3.5 | 1.6 | 2.0 | 6.0 | |
| Workability | | Satisfactory | Satisfactory | Satisfactory | Acceptable | Acceptable | |

EXAMPLE 3

Following the procedure of Example 2, but using each of curable resin-impregnated glass cloth layers ($C_1$) respectively containing the epoxy resin in varied weight ratios to the original glass cloth, thereby to obtain finish laminates which were then evaluated for electrical properties with the results being indicated in Table 2.

TABLE 2

| Glass cloth/epoxy resin ratio | 70/30 | 60/40 | 50/50 |
| --- | --- | --- | --- |
| Dielectric constant 12 GHz | 2.4 | 25 | 2.6 |
| Dielectric tangent ($\times 10^{-3}$) 12 GHz | 1.5 | 2.6 | 3.8 |

EXAMPLE 4

The layers were overlapped one another in the order of D/$C_1$/B/$A_2$/B/$C_1$/D and then pressed by a heat press molder at 170° C. and 5 Kg/cm² for 30 minutes to obtain a finish laminate which was tested for peel strength (bond strength), electrical properties (dielectric constant, dielectric tangent and insulation resistance), water absorbability and workability with the results being shown in Table 3.

EXAMPLE 5

The same layers as used in Example 4 were overlapped one another in the order of $D/C_1/B/A_2/B/C_1/B/A/B/C_1/D$ and then pressed in the same manner as in Example 4 thereby to obtain a finish laminate which was then tested as in Example 4. The results are indicated in Table 3.

TABLE 3

| Test item | Test Condition | Example 4 | Example 5 |
|---|---|---|---|
| Peel strength (Kg/cm) | 23° C. | 1.8 | 1.8 |
| Dielectric constant | 12 GHz | 2.4 | 2.5 |
| Dielectric tangent | 12 GHz | $1.5 \times 10^{-3}$ | $2.0 \times 10^{-3}$ |
| Insulation resistance Ω | 23° C. | $4 \times 10^{14}$ | $6 \times 10^{14}$ |
| Water absorbability % | 23° C., 24 hr | 0.01 | 0.01 |
| Workability | — | Satisfactory | Satisfactory |

EXAMPLE 6

Following the same procedure as used in Example, but using the glass cloth layers (C) in place of curable resin-impregnated glass cloth layers ($C_1$) as used in Example 1, all the layers were overlapped one another in the order of $D/B/C/B/A_2/B/C/B/D$ and then pressed together by a heat press molder at 170° C. and 5 Kg/cm² for 30 minutes thereby to obtain a finish laminate which was then tested for the same items as in Example 4. The results are shown in Table 4.

EXAMPLE 7

The layers of the same kinds as in Example 6 were overlapped one another in the order of $D/B/C/B/A/B/C/B/A_2/B/C/B/D$ as indicated in FIG. 2 and then pressed together under the same conditions as used in Example 6 thereby to obtain a finish laminate which was then tested as in Example 6. The results are also shown in Table 4.

TABLE 4

| Test item | Test Condition | Example 6 | Example 7 |
|---|---|---|---|
| Peel strength (Kg/cm) | 23° C. | 5.6 | 5.6 |
| Dielectric constant | 12 GHz | 2.3 | 2.3 |
| Dielectric tangent | 12 GHz | $0.86 \times 10^{-3}$ | $1.0 \times 10^{-3}$ |
| Insulation resistance Ω | 23° C. | $7 \times 10^{13}$ | $9 \times 10^{13}$ |
| Water absorbability % | 23° C. 24 hr | 0.01 | 0.01 |
| Workability | — | Satisfactory | Satisfactory |

EXAMPLE 8

In this Example, resin-impregnated glass cloth layers ($C_2$) were used in place of the layers ($C_1$) as used in Example 2. The resin so impregnated was an epoxy resin and an ethylene-acrylic acid-acrylic acid ethyl ester copolymer in combination.

Preparation of layers ($C_2$) (prepregs)
Formulation of a resin varnish used:
(1) Cycloaliphatic epoxy resin (produced under the tradename of CHISSONOX CX221 by CHISSO CO., Ltd.): 140 g
(2) Ethylene-acrylic acid-acrylic acid ethyl ester copolymer (molecular weight, 2900; acrylic acid concentration, 4.0 mol %; acrylic acid ethyl ester concentration, 2.0 mol %; tradename, NISSEKI REXPOLE; produced by Nippon Petrochemical Co., Ltd.): 578 g
(3) Benzyldimethylamine (BDMA): 0.7 g
(4) Toluene: 2872 g The above materials (1) to (4) were mixed together and dissolved at 80° C. to obtain a resin varnish which was then impregnated into glass cloths, air-dried and further dried in a hot-air drying oven at 160° C. for 12 minutes thereby to obtain prepregs.

The component layers were overlapped one another in the order of $D/C_2/B/A_2/B/C_2/D$ and then pressed together by a heat press molder at 170° C. and 5 Kg/cm² for 30 minutes to prepare a finish laminate which was then evaluated for peel strength (bond strength), electrical properties (dielectric constant, dielectric tangent and insulation resistance), water absorbability and workability. The results are indicated in Table 5.

EXAMPLE 9

The component layers of the same kinds as used in Example 8 were overlapped one another in the order of $D/C_2/B/A_2/B/C_2/B/A_2/B/C_2/D$ and then pressed together in the same manner as used in Example 1, thereby to obtain a finish laminate which was then evaluated as in the other Examples. The results are shown in Table 5.

TABLE 5

| Test item | Test Condition | Example 8 | Example 9 |
|---|---|---|---|
| Peel strength (Kg/cm) | 23° C. | 1.8 | 1.8 |
| Dielectric constant | 12 GHz | 2.4 | 2.4 |
| Dielectric tangent | 12 GHz | $1.2 \times 10^{-3}$ | $1.6 \times 10^{-3}$ |
| Insulation resistance Ω | 23° C. | $6 \times 10^{13}$ | $8 \times 10^{13}$ |
| Water absorbability % | 23° C., 24 hr | 0.01 | 0.01 |
| Workability | — | Satisfactory | Satisfactory |

As has been so far described, the finish laminate for high-frequency circuits according to this invention is excellent in electrical properties, bond strength and the like which are required for such finish laminates and also excellent in solder heat resistance for the facilitation of heat diffusion, dimensional stability, mechanical strength and substantial freedom of warp owing to the formation of a multilayer structure consisting of ultrahigh molecular-weight polyolefin layers, adhesive layers, glass cloth layers or curable resin-impregnated glass cloth layers in the specific lamination orders. Further, the finish laminates of this invention are inexpensive.

As compared with, for example, conventional copper-covered epoxy resin-impregnated glass cloth laminates, the finish laminates of this invention are excellent in high-frequency characteristics; more specifically, the latter causes a lower lose than the former when used in microwave apparatuses such as parabola antennae and planar antennae.

Further, as compared with copper-covered fluorine resin-impregnated glass cloth laminates, the finish laminates of this invention are satisfactory in workability, inexpensive and exhibit stable electrical properties under various circumstances.

What is claimed is:

1. A finish laminate for high-frequency circuits, which consists of a metal foil-covered multilayer structure composed of (I) at least one fundamental laminate in which a glass cloth layer (C) is laminated on at least one side of an ultrahigh molecular-weight polyethylene layer (A) with an adhesive layer (B) interposed therebetween, the layer (B) being made of at least one member selected from the group consisting of unsaturated carboxylic compound-modified polyolefins and epoxy group-containing olefinic polymers, one fundamental laminate being able to be laminated with another by interposing therebetween an adhesive layer (B), and (II) a metal foil (D) laminated on at least one outermost layer of the multilayer structure with an adhesive layer (B) interposed between said metal foil and outermost layer.

2. A finish laminate according to claim 1, wherein the layers (A), (B), (C) and (D) have thicknesses of 30–1000 $\mu$m, 10–100 $\mu$m, 30–100 $\mu$m and 5–70 $\mu$m, respectively.

3. A finish laminate according to claim 1, wherein the ultrahigh polyethylene layer (A), 4 of the adhesive layer (B) and two of the metal foil (D) are laminated together in the order of D/B/C/B/A/B/C/B/D.

4. A finish laminate according to claim 1, wherein the ultrahigh molecular-weight polyethylene of the layer (A) has a limiting viscosity number of at least 8 dl/g in decalin solution at 135° C.

5. A finish laminate according to claim 1, wherein the carboxylic compound is an unsaturated carboxylic acid or a derivative thereof, and the adhesive layer (B) is obtained by adding the unsaturated carboxylic acid or derivatives thereof to polyolefin in an amount by weight of 0.05–10% of the polyolefin.

6. A finish laminate according to claim 1, wherein the metal foil is a copper foil.

7. A finish laminate according to claim 1, wherein the carboxylic compounds is maleic anhydride, and the epoxy group-containing olefinic polymers are those prepared from ethylene and unsaturated glycidyl group-containing monomer or from ethylene, unsaturated glycidyl group-containing monomer and ethylenically unsaturated monomer.

8. A finish laminate according to claim 7, wherein the epoxy group-containing olefinic polymers are those comprising, by weight, 50–99.95% of ethylene, 0.05–50% of glycidyl group-containing monomer and 0–49.95% of ethylenically unsaturated monomer.

9. A finish laminate according to claim 7, wherein the unsaturated glycidyl group-containing monomer is glycidyl acrylate or glycidyl methacrylate.

10. A finish laminate for high-frequency circuits, which consists of a metal foil-covered multilayer structure composed of (I) at least one fundamental laminate in which a member selected from a resin-containing glass cloth layer ($C_1$) impregnated with a curable resin and a resin-containing glass cloth layer ($C_2$) impregnated with both a curable resin and at least on ethylenic copolymer selected from the group consisting of ethylene-carboxylic acid copolymers, ethylene-carboxylic acid ester copolymers, ethylene-carboxylic acid-carboxylic acid ester copolymers and salts thereof, is laminated on at least one side of an ultrahigh molecular-weight polyethylene layer (A) with an adhesive layer (B) interposed between said resin-containing layer ($C_1$) or ($C_2$) and ultrahigh molecular-weight polyethylene layer (A), the layer (B) being made of at least one member selected from the group consisting of unsaturated carboxylic compound-modified polyolefins and epoxy group-containing olefinic polymers, one fundamental laminate being able to be laminated with another by interposing therebetween an adhesive layer (B), and (II) a metal foil (D) laminated on at least one outermost layer of the multilayer structure with the proviso that an adhesive layer (B) need not be interposed between the outermost layer and metal foil when said outermost layer is a resin-containing glass cloth layer ($C_1$) or ($C_2$), but it need be interposed therebetween when said outermost layer is a polyethylene layer (A).

11. A finish laminate according to claim 10, wherein the layers (A), (B), ($C_1$), ($C_2$) and (D) have thicknesses of 30–1000 $\mu$m, 10–100 $\mu$m, 20–150 $\mu$m, 20–150 $\mu$m and 5–70 $\mu$m, respectively.

12. A finish laminate according to claim 10, wherein the ultrahigh molecular-weight polyethylene layer (A), two of the adhesive layer (B), two of the resin-containing glass cloth layer ($C_1$) and two of the metal foil (D) are laminated together in the order of $D/C_1/B/A/B/C_1/D$.

13. A finish laminate according to claim 10, wherein the ultrahigh polyethylene layer (A), two of the adhesive layer (B), the resin-containing glass cloth layer ($C_2$) and two of the metal foil (D) are laminated together in the order of $D/C_2/B/A/B/C_2/D$.

14. A finish laminate according to claim 10, wherein the curable resin is an epoxy resin.

15. A finish laminate according to claim 10, wherein the curable resin is a polyester resin, bisphenol type epoxy resin, resol-type phenol resin, melamine resin or diallyl phthalate resin, and the ethylenic copolymer is an ethylene-carboxylic acid copolymer, ethylene-carboxylic acid ester copolymer, ethylene-carboxylic acid-carboxylic acid ester copolymer or salts thereof.

16. A finish laminate according to claim 15, wherein the ethylenic copolymer is an ethylene-(meth)acrylic acid copolymer, ethylene-(meth)acrylic acid ester copolymer or ethylene-(meth)acrylic acid-(meth)acrylic acid ethyl ester copolymer.

17. A finish laminate according to claim 15, wherein the ethylenic copolymer has a viscosity average molecular weight of as low as 500–20000.

18. A finish laminate according to claim 17, wherein the ethylenic copolymer of a low molecular weight is obtained by thermally reducing in molecular weight such as ethylenic copolymer of a comparatively high molecular weight.

* * * * *